US 6,468,812 B2

(12) United States Patent
Widmann et al.

(10) Patent No.: US 6,468,812 B2
(45) Date of Patent: Oct. 22, 2002

(54) METHOD FOR PRODUCING A SEMICONDUCTOR MEMORY DEVICE WITH A MULTIPLICITY OF MEMORY CELLS

(75) Inventors: Dietrich Widmann, Unterhaching; Georg Tempel, Munich, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/826,231

(22) Filed: Apr. 4, 2001

(65) Prior Publication Data

US 2001/0012658 A1 Aug. 9, 2001

Related U.S. Application Data

(62) Division of application No. 09/200,095, filed on Nov. 25, 1998, now Pat. No. 6,232,169, which is a division of application No. 08/637,163, filed on Apr. 24, 1996, now Pat. No. 5,869,860.

(30) Foreign Application Priority Data

Apr. 24, 1995 (EP) .............................. 95106101

(51) Int. Cl.[7] .......................................... H01L 21/8239

(52) U.S. Cl. ........................ 438/3; 438/243; 438/386

(58) Field of Search ............................ 438/3, 238–265, 438/381, 386–399; 257/295–313, 528, 532–535

(56) References Cited

U.S. PATENT DOCUMENTS 4,946,710 A * 8/1990 Miller ..................... 427/126.3
5,101,251 A 3/1992 Wakamiya et al.
5,172,202 A * 12/1992 Kazuo ....................... 257/306

(List continued on next page.)

FOREIGN PATENT DOCUMENTS

DE 39 22 456 A1 1/1990
DE 41 07 165 A1 10/1991
EP 0 503 165 A1 9/1992

OTHER PUBLICATIONS

"Ferroelectrics and High Permittivity Dielectrics for Memory Applications" (Larsen et al.), Aug. 1993, Microelectronic Engineering Nos. 1/4, pp. 53–60, Amsterdam.

(List continued on next page.)

Primary Examiner—Eddie Lee
Assistant Examiner—Marcos D. Pizarro-Crespo
(74) Attorney, Agent, or Firm—Laurence A. Greenberg; Werner H. Stemer; Ralph E. Locher

(57) ABSTRACT

A method for producing a capacitor having a dielectric and first and second capacitor electrodes in a semiconductor circuit device formed on a semiconductor substrate, includes forming a trench in a layer applied to the substrate. An electrically conductive layer for the second capacitor electrode is deposited inside the trench and at least regionally conformally with side walls thereof. An auxiliary layer acting as a space-holder for the dielectric is conformally deposited inside the trench and on the electrically conductive layer for the second capacitor electrode. An electrically conductive layer for the first capacitor electrode is conformally deposited inside the trench and on the auxiliary layer. The auxiliary layer is at least partially removed to expose a hollow layer in at least a partial region between the two electrically conductive layers for the first and second capacitor electrodes. The dielectric is deposited into the exposed hollow layer between the two electrically conductive layers. A semiconductor memory device and a method for producing the device include producing the capacitor after production of the transistor and metallizing layers associated therewith for connection of the word and bit lines, in a configuration projecting upward from the plane; placing the capacitor in a trench formed inside a contact metallizing layer for the second electrode terminal of the transistor; and setting a depth of the trench to be equivalent to a layer thickness of the metallizing layer.

4 Claims, 2 Drawing Sheets

U.S. PATENT DOCUMENTS

| | | |
|---|---|---|
| 5,262,343 A | 11/1993 | Rhodes et al. |
| 5,567,964 A | 10/1996 | Kashihara et al. |
| 5,828,092 A | 10/1998 | Tempel |
| 5,977,589 A | 11/1999 | Schloesser et al. |
| 6,083,765 A | 7/2000 | Tempel |
| 6,127,220 A | 10/2000 | Lange et al. |

OTHER PUBLICATIONS

"Integration of Ferroelectric Capacitor Technology with CMOS" (Moazzami et al.), Symposium on VLSI Technology Digest of Technical papers, 1994, pp. 55–56.

* cited by examiner

METHOD FOR PRODUCING A SEMICONDUCTOR MEMORY DEVICE WITH A MULTIPLICITY OF MEMORY CELLS

CROSS-REFERENCE TO RELATED APPLICATIONS

This is a division of U.S. application Ser. No. 09/200,095, filed Nov. 25, 1998, now U.S. Pat. No. 6,232,169 which was a division of U.S. application Ser. No. 08/637,163, filed Apr. 24, 1996, now U.S. Pat. No. 5,869,860.

BACKGROUND OF THE INVENTION

Field of the Invention

The invention relates to a method for producing a semiconductor memory device having a multiplicity of memory cells disposed on a semiconductor substrate, wherein each of the memory cells has a selection transistor being disposed in a semiconductor substrate and having a gate terminal and first and second electrode terminals, each of the memory cells has a storage capacitor being associated with and triggerable by the selection transistor and having a ferroelectric dielectric and first and second capacitor electrodes, the gate terminal of each selection transistor is connected to a word line of the semiconductor memory device, the first electrode terminal of each selection transistor is connected to a bit line, and the first capacitor electrode of each storage capacitor is connected to a common conductor layer of electrically conductive material. The invention also relates to a method for producing such a semiconductor memory device.

Such a semiconductor memory device having a storage capacitor with a ferroelectric dielectric (a so-called FRAM) is known, for instance, from The 1994 Symposium on VLSI Technology Digest of Technical Papers, pp. 55 ff. by R. Moazzami et al, and from The 1994 IEEE International Solid-State Circuits Conference, pp. 268 ff. by Tatsumi Sumi et al. In that semiconductor memory device the storage capacitors with the ferroelectric dielectric are constructed in planar fashion and additionally, because of the wiring, have cell surface areas of considerable size per bit, which is considered to be disadvantageous in the view of a desired large scale of integration. Despite the problems that so far still exist, a great future is predicted for ferroelectric memories or FRAMs. They could entirely replace present semiconductor memories (DRAMs, SRAMS, EEPROMS, flash EEPROMS). The advantage of FRAMs resides above all in the brief programming time (>20 ns), a low programming-voltage (from about 3 V of supply voltage to the ICs), low energy-consumption in programming (no charge pump required), and frequent programmability ($10^{12}$ demonstrated and $101^5$ expected, as compared with $10^5$ in EEPROMS). Examples of materials for the ferroelectric layer that appear especially promising at present are lead zirconium titanate, strontium tantalate, or compounds thereof. One of the problems that are still an obstacle to rapid introduction of FRAM technology is an as-yet unsolved compatibility with a production process for integrated circuits. In particular, the necessity for platinum electrodes in the ferroelectric storage capacitor and spin-on coating, which heretofore has been conventional, for applying a ferroelectric gel, which is associated with a relatively great layer thickness and thus a capacitance that requires a large surface area, heretofore prevented profitable use in semiconductor technology, so that heretofore no process for producing FRAMs that was suitable for mass production was known. In that respect it must also be remembered that depositing the relatively complex materials for the ferroelectric dielectric and associated therewith the problem of a satisfactory source suitable for the process, and moreover a lack of quality of the layers because of fissuring, leakage currents, temperature influences and electrode adhesion, all contribute to problems of process integration. In particular, the ferroelectric materials known heretofore react especially sensitively to hydrogen. However, hydrogen can hardly be suppressed in the known methods for producing a semiconductor memory device, and in such methods it occurs especially in plasma deposition processes and plasma etching processes.

In addition to the FRAM cells, large-scale integration DRAM semiconductor memories with conventional materials for the storage capacitor dielectric are known. In order to make DRAM semiconductor memories with a memory capacity of up to about 256 MB at present, dielectrics with a high dielectric constant are used so that as the cell area becomes smaller an adequate capacitance, typically of more than about 20 fF per cell, is still attainable. Heretofore, for those purposes, an ONO layer has been used in most cases, but its technological limits have become apparent in the meantime, since upon a further reduction in thickness the leakage current rises above the predetermined limit value, and adequate capacitances (surface areas) can be obtained only through the use of such complicated structures as trench or stacked capacitors. For those reasons, new materials that have a high enough dielectric constant are therefore increasingly being used for the dielectric of the storage capacitor. However, the alternative dielectric materials known thus far are extremely sensitive to the usual strains arising in the method used heretofore to produce a semiconductor memory device, namely stability to high process temperatures, undesired chemical reactions, and the like.

SUMMARY OF THE INVENTION

It is accordingly an object of the invention to provide a method for producing a semiconductor memory device, which overcomes the hereintofore-mentioned disadvantages of the heretofore-known methods and devices of this general type, in which the semiconductor memory device has a ferroelectric storage capacitor that has a scale of integration which is virtually comparable to present DRAM circuits with suitably high reliability and quality, and in which the method for producing such a semiconductor memory device can be integrated at comparatively little expense into existing process sequences and is suitable for mass production, or in other words that enables a high yield of finished semiconductor circuit devices or semiconductor memory devices with ferroelectric storage capacitors, with the least possible number of premature failures.

With the foregoing and other objects in view there is provided, in accordance with the invention, a method for producing a capacitor having a dielectric, a first capacitor electrode and a second capacitor electrode in a semiconductor circuit device formed on a semiconductor substrate, which comprises forming a trench in a layer applied to the substrate of the semiconductor circuit device; depositing an electrically conductive layer for the second capacitor electrode in a deposition being inside the trench and at least regionally conformal with side walls of the trench; conformally depositing an auxiliary layer acting as a space-holder for the dielectric in a deposition being inside the trench and on the electrically conductive layer for the second capacitor electrode; conformally depositing an electrically conductive layer for the first capacitor electrode in a deposition being inside the trench and on the auxiliary layer; at least partial removing the auxiliary layer and exposing a hollow layer in at least a partial region between the two electrically conductive layers for the first and second capacitor electrodes; and depositing the dielectric into the exposed hollow layer between the two electrically conductive layers for the first and second capacitor electrodes.

In accordance with another mode of the invention, the step of deposition of the dielectric layer is performed through the is use of spin-on coating.

In accordance with a further mode of the invention, the dielectric layers are applied with a layer thickness in the nanometer range, which because of their viscous, paintlike consistency can preferably be applied by spin-on coating.

The dielectric, having a material which is preferably in the form of a substrate introduced by spin-on coating in a solvent, is deposited into the exposed hollow layer between the two electrically conductive layers for the first and second capacitor electrodes.

In accordance with an added mode of the invention, the dielectric is a ferroelectric gel that is applied by spin-on coating. Moreover, the dielectric may also be some other, not necessarily ferroelectric substance that can be applied by the spin-on coating process, namely a substance for the dielectric having a higher dielectric constant than the previously known substances.

With the objects of the invention view there is also provided a semiconductor memory device, comprising a semiconductor substrate having a surface defining a plane extending substantially parallel to the surface; a multiplicity of memory cells disposed on the semiconductor substrate; each of the memory cells including a selection transistor being disposed in the plane and having a gate terminal, a first electrode terminal and a second electrode terminal, the second electrode terminal having a contact metallizing layer with a given layer thickness; each of the memory cells including a storage capacitor being associated with and triggerable by the selection transistor, the storage capacitor having a ferroelectric dielectric, a first capacitor electrode and a second capacitor electrode, the storage capacitor having a configuration projecting upward from the plane, the storage capacitor being disposed in a trench formed inside the contact metallizing layer, and the trench having a depth being equivalent to the given layer thickness; a word line to which the gate terminal of each of the selection transistors is connected; a bit line to which the first electrode terminal of each of the selection transistors is connected; and a common conductor layer of electrically conductive material to which the first capacitor electrode of each of the storage capacitors is connected.

This embodiment of the storage capacitor with the ferroelectric dielectric in an upward-projecting configuration makes it possible, with the smallest possible surface area of the FRAM cell, to nevertheless achieve an adequate capacitance of the storage capacitor. The embodiment according to the invention with a configuration of the ferroelectric storage capacitor that projects upward from the plane of the substrate surface permits the use of the ferroelectric, which is considered to be critical in view of the desired large scale of integration, after complete production of the components of the memory cell that are less critical in this respect, that is selection transistors with complete metallizing including associated electrodes. This is preferably carried out in such a way that. the ferroelectric gel to be applied through the use of spin technology is applied inside a thin hollow layer formed between the two capacitor electrodes. The hollow layer likewise has a configuration that projects upward from the plane of the substrate surface.

In accordance with another feature of the invention, the storage capacitor having the ferroelectric dielectric projecting upward from the plane of the substrate surface is constructed substantially cylinder-symmetrically, with a center axis of the cylinder extending approximately perpendicular to the plane of the substrate surface.

In accordance with a further feature of the invention, the second capacitor electrode of the storage capacitor is constructed inside the trench as a metal spacer deposited conformally onto vertical side walls of the trench.

In accordance with an added feature of the invention, the first capacitor electrode of the storage capacitor has an electrode segment formed inside the trench and extending coaxially with the lengthwise extension of the trench and opposite the second capacitor electrode, and the ferroelectric dielectric is disposed at least between the electrode segment of the first capacitor electrode and the second capacitor electrode.

In accordance with an additional feature of the invention, the first capacitor electrode of the storage capacitor is constructed in cup-like fashion inside the second capacitor electrode.

With the objects of the invention view there is additionally provided a method for producing a semiconductor memory device, which comprises placing a multiplicity of memory cells on a semiconductor substrate having a surface; providing each of the memory cells with a selection transistor being disposed in a plane extending substantially parallel to the surface of the substrate and having a gate terminal, a first electrode terminal and a second electrode terminal; providing each of the memory cells with a storage capacitor being associated with and triggerable by the selection transistor and having a ferroelectric dielectric, a first capacitor electrode and a second capacitor electrode; connecting the gate terminal of each selection transistor to a word line of the semiconductor memory device; connecting the first electrode terminal of the selection transistor to a bit line; connecting each first capacitor electrode of the storage capacitor to a common conductor layer of electrically conductive material; producing the storage capacitor after production of the selection transistor and metallizing layers associated with the storage capacitor for connection of the word and bit lines, in a configuration projecting upward from the plane; placing the storage capacitor in a trench formed inside a contact metallizing layer for the second electrode terminal of the selection transistor; and setting a depth of the trench to be equivalent to a layer thickness of the contact metallizing layer.

In this case the concept of the method of the invention is based initially on the recognition of disclosing a semiconductor memory device or a process sequence for producing the semiconductor memory device, in which the ferroelectric materials can be successfully tied into the process sequence for producing the semiconductor memory device, specifically by providing that not until after the production of the completely constructed selection transistors, together with complete metallizing and including all of the electrodes associated with the selection transistor, is the dielectric material applied and subjected to a heat treatment to perform the necessary crystallization.

The method of the invention makes it possible to produce a FRAM memory device having a surface area requirement which is as slight as that for a RTAM cell, specifically through the use of a sequence of process steps that can be integrated into existing process sequences. In particular, the layer thickness of the ferroelectric dielectric can be adjusted exactly, preferably in the nm range.

In accordance with another mode of the invention, the method for producing a semiconductor memory device with a storage capacitor having a ferroelectric dielectric is performed by the following steps, after production of the selection transistor: full-surface application of an insulation cover layer; formation of a contact metallizing layer for the second electrode terminal of the selection transistor; etching of a trench, extending as far as the insulating cover layer, inside the contact metallizing layer; deposition, in a manner conformal to the side walls of the trench, of an electrically conductive layer for the second capacitor electrode inside the trench; conformal deposition of an auxiliary layer, acting as a space-holder for the ferroelectric dielectric, inside the trench and onto the electrically conductive layer for the second capacitor electrode; conformal deposition of an electrically conductive layer for the first capacitor electrode inside the trench and onto the auxiliary layer; at least partial removal of the auxiliary layer and resultant exposure of a hollow layer in at least a partial region between the two electrically conductive layers for the first and second capacitor electrodes; and deposition of the ferroelectric dielectric into the exposed hollow layer between the two electrically conductive layers for the first and second capacitor electrodes.

In accordance with a further mode of the invention, the step of depositing the dielectric layer having the ferroelectric dielectric is carried out through the use of spin-on coating.

In accordance with an added mode of the invention, the method includes back-etching of the electrically conductive layer deposited conformally with the inner contour of the trench for the second capacitor electrode, at least far enough to ensure that the portion of the electrically conductive layer, deposited in planar fashion outside the trench, for the second capacitor electrode, is removed. In this way, the danger of an electrical short circuit of the two capacitor electrodes is reduced.

In an especially preferred feature of the semiconductor memory device or of the method of the invention, the ferroelectric dielectric is a ferroelectric gel, which in particular has a lead zirconium titanate (PZT) and/or a strontium tantalate compound.

The material including the layer for the first and/or second capacitor electrode also preferably has titanium and/or platinum, wherein the layer for the first and/or the second capacitor electrode may also be constructed as a multiple layer, preferably with a layer sequence of titanium/titanium nitride/platinum or titanium/titanium nitride/tungsten.

Other features which are considered as characteristic for the invention are set forth in the appended claims.

Although the invention is illustrated and described herein as embodied in a method for producing a semiconductor memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
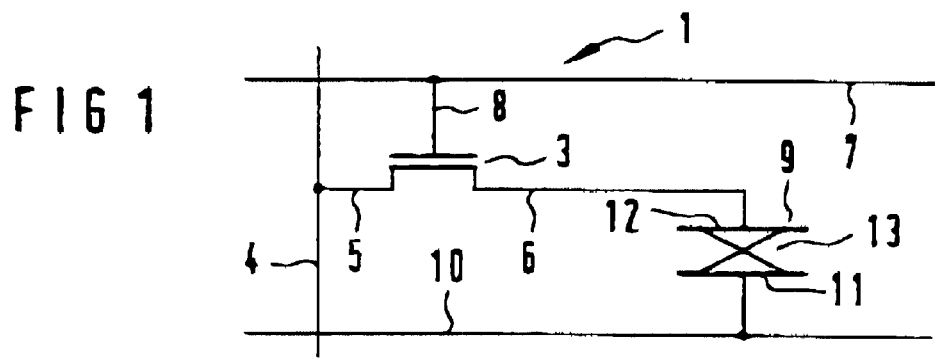
FIG. 1 is a basic schematic circuit diagram of a semiconductor device according to the invention having a FRAM cell.

Referring now to the figures of the drawings in detail and first, particularly, to FIG. 1 thereof, there is seen a substitute circuit diagram of a semiconductor memory device of the invention having a ERM cell 1 with a selection transistor 3, preferably of the MOS type, which is formed on a semiconductor substrate 2 (shown in FIG. 2) and which has a first electrode terminal 5 (source) connected to a bit line 4 made of tungsten or polycide, a second electrode terminal 6 (drain) and a gate terminal 8 connected to a word line 7 made of $n^+$ polysilicon or polycide. The FRAM cell 1 also has a storage capacitor 9 with a first capacitor electrode 11 connected to a common conductor layer 10 (field plate), a second capacitor electrode 12 connected to the second electrode terminal 6 of the selection transistor 3 and a ferroelectric dielectric 13 inserted between the first and second capacitor electrodes.

Figure 2:
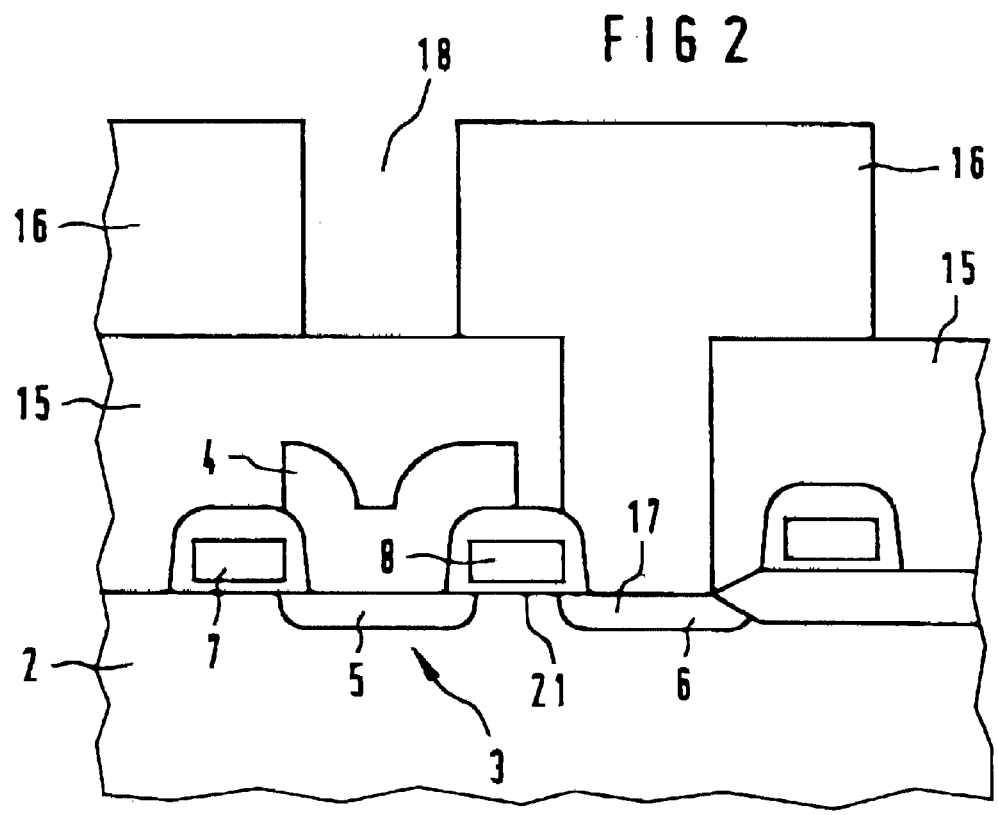
FIGS. 2–4 are fragmentary, diagrammatic, sectional views showing successive method steps in the production of the semiconductor memory device of the invention.
Figure 3:
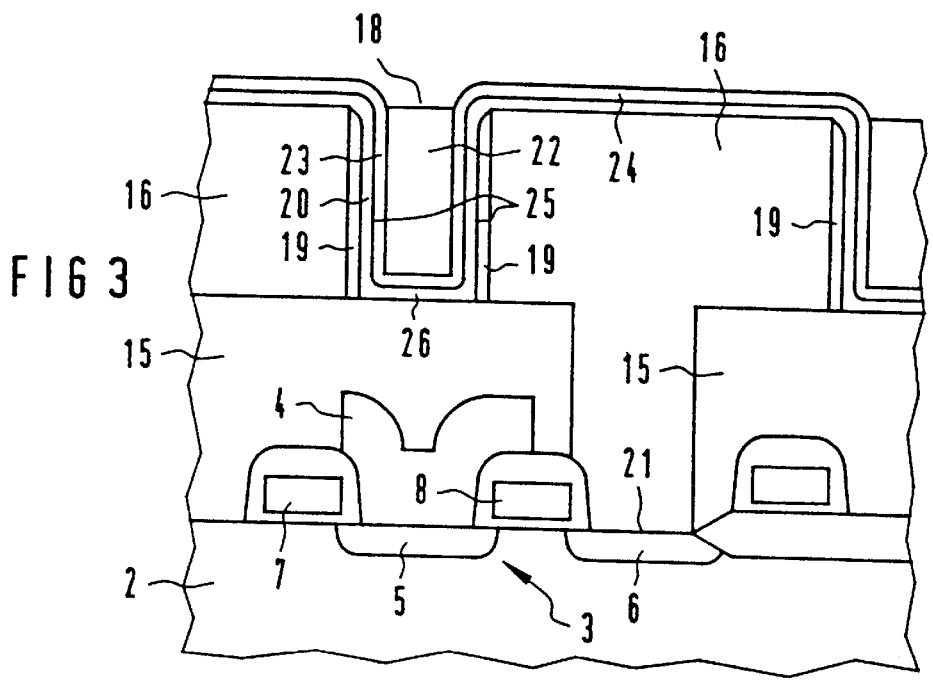
Figure 4:
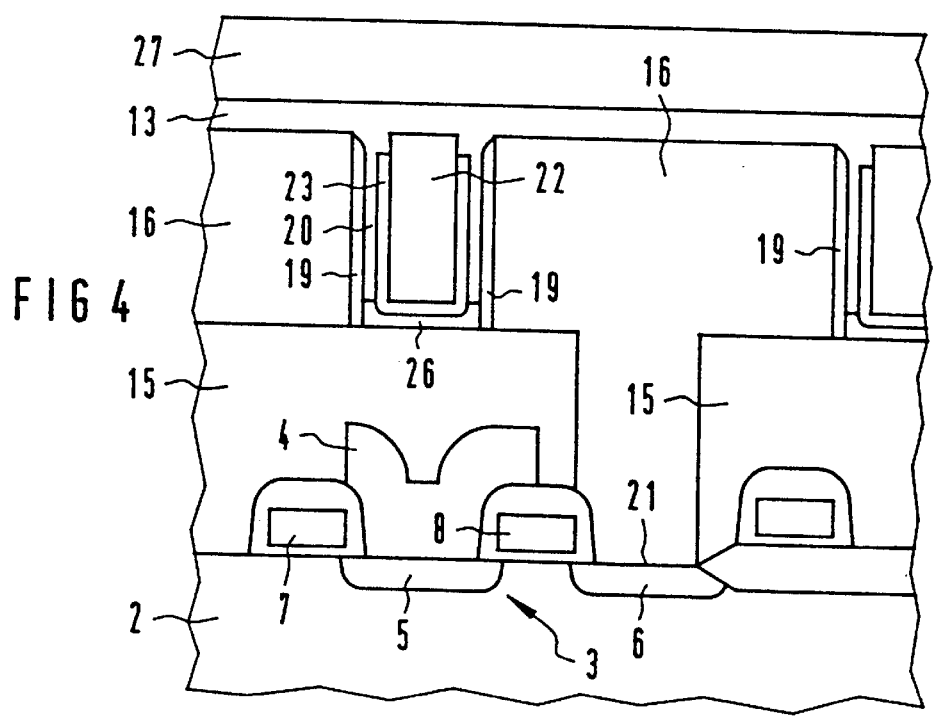

The point of departure of the exemplary embodiment of the method of the invention for producing the semiconductor memory device shown in FIGS. 2–4 is a configuration that is shown in FIG. 2 through the use of method steps which are known from the DRAM process up to and including the production of the bit line 4. In this configuration, a planarized insulated cover layer 15, for instance a BPSG flow glass, is deposited over the entire surface. A self-adjusted (overlapping) contact metallizing layer 16 for connection of an $n^+$-doped drain region 17 (of the second electrode terminal 6) of the selection transistor 3 is also formed. The contact metallizing layer 16 is deposited conformally, preferably as an n+ polysilicon layer with a thickness of approximately 0.7 $\mu$m.

Subsequently, through the use of an anisotropic etching operation, a trench 18 that is constructed to project upward from a plane 21 of the substrate surface, is formed in the contact metallizing layer 16. It is disposed directly above the region of the selection transistor 3 and extends as far as the BPSG layer 15.

Subsequently, as is shown in FIG. 3, an electrically conductive layer 19, that is a metal space-holder ("spacer") is produced at vertical side walls of the trench 18 through the use of conformal deposition and ensuing anisotropic back-etching of the electrically conductive layer 19. The space-holder (spacer) preferably has layers in the order of Ti/TiN/Pt or Ti/TiN/W.

As is shown in FIG. 3, an auxiliary layer 20 of $SiO_2$ is deposited conformally inside the trench 18 onto the electrically conductive layer 19 on the thus-created configuration. The layer 20 acts as a space-holder for the ferroelectric dielectric and the thickness of the $SiO_2$ auxiliary layer 20 is equivalent to the later ferroelectric layer. In order to produce the common capacitor plate 10, an electrically conductive layer 23, preferably including a high-temperature-stable metal such as platinum or tungsten, is deposited conformally onto the $SiO_2$ auxiliary layer 20. A remaining hollow space in the trench 18 is filled with a suitable filler material 22. The filler material 22, for instance including polysilicon, is deposited conformally and is preferably anisotropically back-etched. In this way, the configuration shown in FIG. 3 is created.

In the next step, the electrically conductive layer 23 including platinum or tungsten is back-etched at least far enough to ensure that a portion 24 of the electrically conductive layer 23 located at horizontal regions is removed.

After a heat treatment is performed, with attendant curing of all of the prior process steps, the material of the auxiliary layer 20 acting as a space-holder for the ferroelectric dielectric is etched free, preferably wet chemically, for instance with dilute hydrofluoric acid, specifically at least far enough to ensure that a hollow layer 25 oriented substantially nearly vertically from the plane 21 of the substrate surface is formed between the two layers 19 and 23 for the capacitor electrodes 11 and 12. In this hollow layer, a thin film of a ferroelectric gel is then applied, preferably through the use of spin-coating (spin-on technology). Voids between the two capacitor plates 19 and 23 are filled with the ferroelectric gel in the process. The ferroelectric dielectric is subjected to a heat treatment step for the sake of crystal formation in it. A bottom 26 left standing in the wet chemical etching of the material including the auxiliary layer 20 serves to mechanically brace the first capacitor electrode 11 located coaxially inside the trench 18.

Next, as is shown in FIG. 4, a passivation layer 27, preferably of $SiO_2$, is deposited over the entire surface.

This can be followed by further process steps in a manner that is known per se, for instance for metallizing.

We claim:

1. A method for producing a semiconductor memory device, which comprises:

placing a multiplicity of memory cells on a semiconductor substrate having a surface;

providing each of the memory cells with a selection transistor being disposed in a plane extending substantially parallel to the surface of the substrate and having a gate terminal, a first electrode terminal and a second electrode terminal;

providing each of the memory cells with a storage capacitor being associated with and triggerable by the selection transistor and having a ferroelectric dielectric, a first capacitor electrode and a second capacitor electrode; connecting the gate terminal of each selection transistor to a word line of the semiconductor memory device;

connecting the first electrode terminal of the selection transistor to a bit line;

connecting each first capacitor electrode of the storage capacitor to a common conductor layer of electrically conductive material;

producing the storage capacitor after production of the selection transistor and metallizing layers associated with the storage capacitor for connection of the word and bit lines, in a configuration projecting upward from the plane;

placing the storage capacitor in a trench formed inside a contact metallizing layer for the second electrode terminal of the selection transistor; and setting a depth of the trench to be equivalent to a layer thickness of the contact metallizing layer.

2. The method for producing a semiconductor memory device according to claim 1, which comprises producing the storage capacitor by:

full-surface application of an insulating cover layer;

formation of the contact metallizing layer for the second electrode terminal of the selection transistor;

etching the trench to extend as far as the insulating cover layer, inside the contact metallizing layer;

depositing an electrically conductive layer for the second capacitor electrode inside the trench, conformally to side walls of the trench;

conformally depositing an auxiliary layer acting as a space-holder for the ferroelectric dielectric inside the trench and on the electrically conductive layer for the second capacitor electrode;

conformally depositing an electrically conductive layer for the first capacitor electrode inside the trench and on the auxiliary layer;

at least partially removing the auxiliary layer and exposing a hollow layer in at least a partial region between the two electrically conductive layers for the first and second capacitor electrodes; and depositing the ferroelectric dielectric into the exposed hollow layer between the two electrically conductive layers for the first and second capacitor electrodes.

3. The method for producing a semiconductor memory device according to claim 2, which comprises carrying out the step of depositing the ferroelectric dielectric by spin-on coating.

4. The method for producing a semiconductor memory device according to claim 2, which comprises back-etching the electrically conductive layer for the second capacitor electrode at least far enough to remove a portion of the electrically conductive layer for the second capacitor electrode deposited in planar fashion outside the trench.

* * * * *